United States Patent

Preuss et al.

[11] Patent Number: 5,949,249
[45] Date of Patent: Sep. 7, 1999

[54] DRIVER HAVING INDUCTANCE-CONTROLLED CURRENT SLEW RATE

[75] Inventors: Curtis Walter Preuss; Robert Russell Williams, both of Rochester, Minn.

[73] Assignee: International Business Machines Corporation, Armonk, N.Y.

[21] Appl. No.: 08/838,572

[22] Filed: Apr. 10, 1997

[51] Int. Cl.$^6$ .................................................. H03K 17/16
[52] U.S. Cl. ................. 326/27; 326/83; 327/108
[58] Field of Search ................. 326/27, 21, 26, 326/17, 83; 327/108

[56] References Cited

U.S. PATENT DOCUMENTS

| | | | |
|---|---|---|---|
| 4,607,210 | 8/1986 | Ohms et al. | 327/108 |
| 5,120,999 | 6/1992 | Schreck et al. | 326/27 |
| 5,153,457 | 10/1992 | Martin et al. | 326/27 |
| 5,406,150 | 4/1995 | Austin | 327/110 |
| 5,736,884 | 4/1998 | Ettes et al. | 327/304 |

*Primary Examiner*—Michael Tokar
*Assistant Examiner*—Daniel D. Chang
*Attorney, Agent, or Firm*—Tyler L. Nasiedlak

[57] ABSTRACT

A control system for minimizing and controlling the current slew rate of an output device by using inductance to directly measure the current slew rate is provided. The control system may, for example, be used to control and minimize the current slew rate through signal drivers and allow for faster drivers and/or larger numbers of drivers on integrated circuit chips. In accordance with one embodiment of the invention, an inductor is serially coupled with an output device. A predriver is coupled to the gate of the output device for providing a voltage slew rate at the output device gate. A comparator is coupled to the inductor for sensing a voltage indicative of a current slew rate through the inductor and outputing a signal indicating whether the current slew rate exceeds or falls below a desired level. A controller responsive to the comparator is provided for controlling the driver to increase and decrease the voltage slew rate at the output device gate when the comparator signal indicates that the current slew rate respectively falls below and exceeds the desired level, thereby controlling the current slew rate through the inductor and through the output device.

42 Claims, 6 Drawing Sheets

| A1 | A2 | A3 | | C1 | C2 | C3 | |
|---|---|---|---|---|---|---|---|
| 0 | 0 | 0 | | 0 | 0 | 0 | ⎫ FAST PREDRIVE |
| 0 | 1 | 1 | | 0 | 0 | 0 | |
| 0 | 1 | 0 | | 1 | 0 | 0 | ⎱ MED FAST |
| 1 | 1 | 1 | | 1 | 0 | 0 | |
| 1 | 0 | 1 | | 1 | 1 | 0 | ⎱ MED SLOW |
| 1 | 1 | 0 | | 1 | 1 | 0 | |
| 1 | 1 | 1 | | 1 | 1 | 1 | ⎱ SLOW PREDRIVE |
| 1 | 1 | 1 | | 1 | 1 | 1 | |

FIGURE 4B

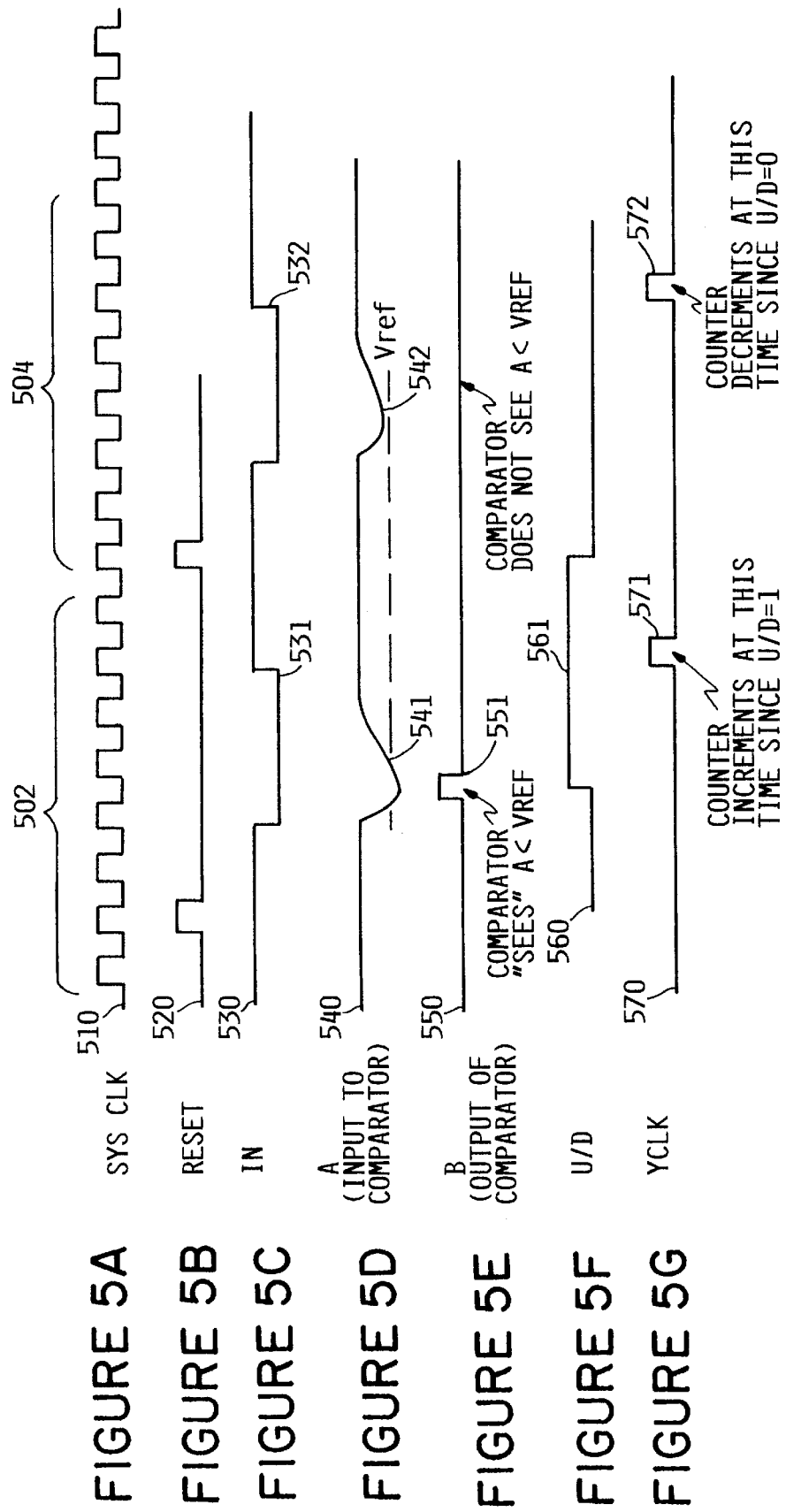

DRIVER HAVING INDUCTANCE-CONTROLLED CURRENT SLEW RATE

FIELD OF THE INVENTION

The present invention is directed generally to driver circuits and, more particularly, to a control system for controlling the current slew rate through an off-chip signal driver.

BACKGROUND OF THE INVENTION

Drivers are commonly used in a wide variety of applications to output signals to electrical components. Drivers may, for example, be used as an interface between circuits of varying voltage levels. Drivers are also often used for signal outputs in single power supply systems. In complimentary metal oxide semiconductor (CMOS) devices; a typical driver includes a predriver coupled to two signal drivers or output devices. One single driver device is typically a p-channel field effect transistor (PFET) or pull-up transistor and the other typically is an n-channel field effect transistor (NFET) or pull-down transistor. An exemplary driver is shown in Nguyen et al., U.S. Pat. No. 5,467,031, the contents of which are herein incorporated by reference.

Two of the more important performance characteristics of a driver circuit are switching speed and noise. Both of these performance characteristics are dependent upon the current slew rate, i.e., the change in current over time (di/dt) through the signal drivers. In particular, the switching speed of a signal driver is generally determined by the minimum current slew rate which is needed to turn-on the signal driver, while noise is dependent upon the maximum current slew rate through the transistor. The current slew rate through signal drivers however varies with variations in the temperature, voltage, and processes to which the signal drivers are subjected. These variations in the signal driver current slew rate limit the speed of present signal drivers as well as the number of signal drivers that can be provided on a given chip or chip set.

SUMMARY OF THE INVENTION

Generally, the present invention relates to a control system for minimizing and controlling the current slew rate of an output device by using inductance to directly measure the current slew rate. The control system may, for example, be used to control and minimize the current slew rate through signal drivers and allow for faster drivers and/or larger numbers of drivers on integrated circuit chips. In accordance with one embodiment of the invention, an inductor is serially coupled with an output device. A predriver is coupled to the gate of the output device for providing a voltage slew rate at the output device gate. A comparator is coupled to the inductor for sensing a voltage indicative of a current slew rate through the inductor and outputting a signal indicating whether the current slew rate exceeds or falls below a desired level. A controller responsive to the comparator is provided for controlling the driver to increase and decrease the voltage slew rate at the output device gate when the comparator signal indicates that the current slew rate respectively falls below and exceeds the desired level, thereby controlling the current slew rate through the inductor and through the output device.

In accordance with another embodiment, an off-chip driver system using an inductor to control current slew rate is provided. The off-chip driver system includes an output device having a gate and one or more signal drivers having a gate. A predriver is coupled with each of the output device and signal drivers to provide a voltage slew rate to the respective output device or signal driver. An inductor is serially coupled with the output device, and a comparator is coupled to the inductor for sensing a voltage indicative of a current slew rate through the inductor and the output device and outputting a signal indicating whether the current slew rate falls below or exceeds a desired level. A controller responsive to the comparator is provided for controlling the predrivers to increase and decrease the voltage slew rate at the gates of output device and signal drivers when the comparator signal indicates that the current slew rate respectively falls below and exceeds the desired level, thereby controlling the current slew rate through the output device and signal drivers.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 5A–5G illustrates exemplary signals from an embodiment of the present invention.

Figure 1:
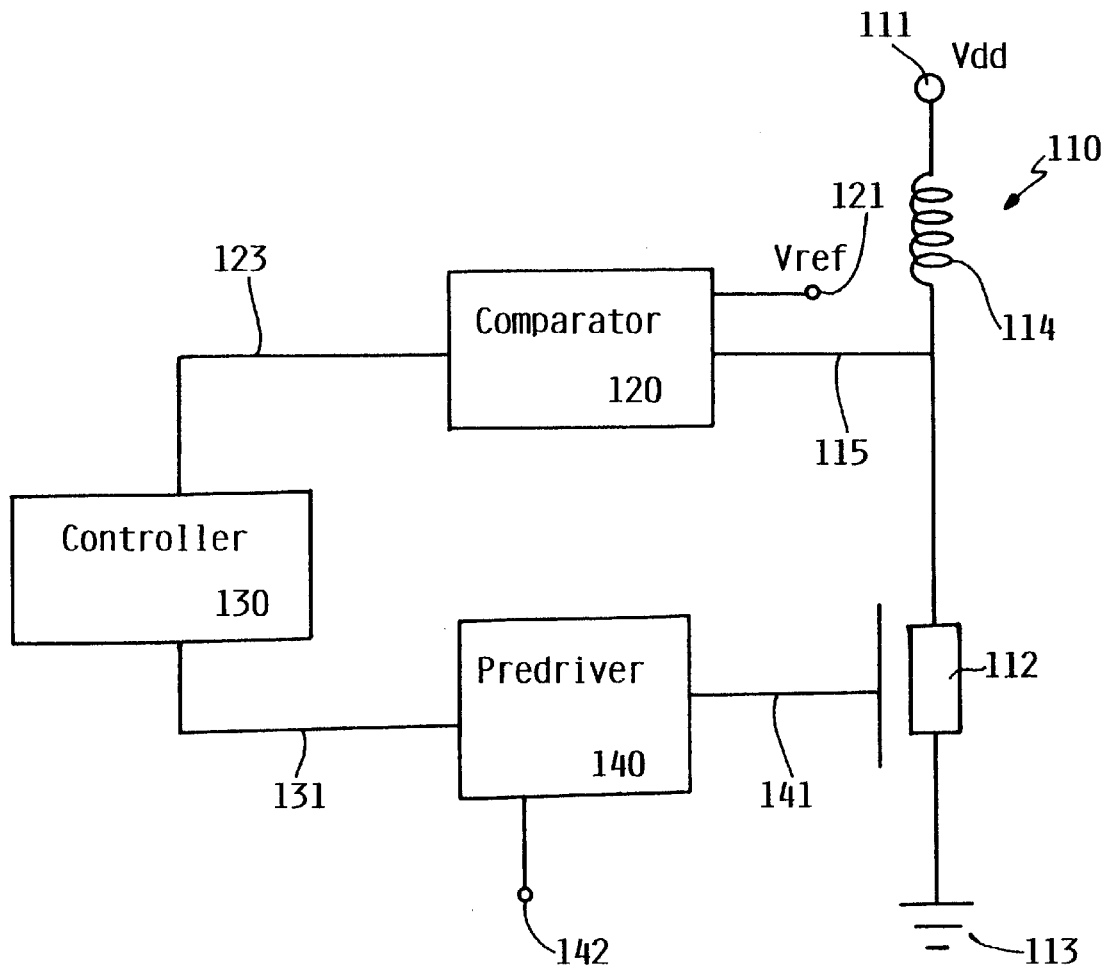
FIG. 1 illustrates an exemplary control system according to the principles of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of drivers in which control of the current slew rate through a driver is desired. The invention is applicable to both single and multiple power supply systems. Aspects of the invention are particularly suited to CMOS off-chip drivers. While the present invention is not so limited, an appreciation of various aspects of the invention will be gained through a discussion of various embodiments of the present invention in connection with the examples provided below.

FIG. 1 illustrates a system 100 for controlling the current slew rate through an output device. The system 100 generally includes a circuit 110 having an inductor 114 and an output device 112 serially coupled between a supply voltage 111 and a ground 113, a comparator 120, a controller 130 and a predriver 140. The term ground as used herein is broadly intended to cover any reference potential, including true ground as well as virtual grounds. The term inductor is intended to broadly cover any device exhibiting an inductance. Moreover, the illustrated location of the inductor 114 is provided by way of example, not limitation.

Generally, the system 100 provides a feedback control loop which measures the current slew rate (di/dt) through the output device 112 and adjusts the voltage slew rate (dV/dt) at the gate of the output device 112 to control and minimize the variation of the current slew rate through the output device 112.

More specifically, in response to an input signal on line 142, the predriver 140 periodically applies a voltage 141 to the gate of the output device 112, typically a PFET or NFET transistor. This induces a current slew rate through the output device 112 and the inductor 114 generally dependent upon the slew rate of the voltage 141 applied to the gate of the output device 112. The term slew rate as used herein refers to the magnitude of the slew rate. It should be appreciated that typically a negative slew rate is applied to a PFET transistor to induce a current therethrough, while a positive slew rate is applied to an NFET transistor to induce a current therethrough. In a typical transistor, the current slew rate is approximately linearly related to the voltage slew rate.

The change in current induces a voltage across the inductor 114 ($\Delta V_L$), as governed by the equation:

$$\Delta V_L = V_{hi} - V_{low} = L \cdot di/dt$$

where L is the inductance of the inductor 114 and $V_{hi}$ and $V_{low}$ are respectively the voltages on the high voltage side and low voltage side of the inductor 114.

Generally, the induced voltage $\Delta V_L$ is sensed to determine whether it exceeds a predetermined threshold, suitably selected based on the desired current slew rate through the circuit 110. If the induced voltage $\Delta V_L$ exceeds the predetermined threshold, a signal indicative of a current slew rate above a desired level is output, while if the induced voltage $\Delta V_L$ exceeds the predetermined threshold, a signal indicative of a current slew rate below the desired level is output.

The induced voltage $\Delta V_L$ may be sensed in a variety of manners. In the exemplary embodiment, the comparator 120 senses the induced voltage $\Delta V_L$ by sensing voltage 115 ($V_{low}$) and compares voltage 115 ($V_{low}$) against a reference voltage 121. As voltage 115 ($V_{low}$) is inversely related to the induced voltage $\Delta V_L$, i.e., as $\Delta V_L$ increases (decreases), voltage 115 ($V_{low}$) decreases (increases), the comparator 120 generates an output signal 123 indicative of a current slew rate above a desired level if voltage 115 falls below the reference voltage 121 and an output signal 123 indicative of a current slew rate below a desired level if voltage 115 exceeds the reference voltage 121.

In an alternate embodiment, the comparator may be a ratioed PFET/NFET CMOS inverter that provides a pulse when its logic threshold is passed. In this embodiment, rather then establishing a predetermined threshold by coupling an input to a reference voltage, the predetermined threshold is set by the ratio of the PFET and NFET design strengths.

The comparator output signal 123 is provided to the controller 130. In response to the output signal 123, the controller 130 outputs a control signal 131 which controls the predriver 140 to increase or decrease the slew rate of the voltage 141 provided to the output device gate. In particular, the controller 130 controls the predriver 140 to increase the slew rate of the voltage 141 when the slew rate of the current is below a desired level (for example, when the voltage 115 ($V_{low}$) exceeds the reference voltage 121) and decrease the slew rate of the voltage 141 when the slew rate of the current is above a desired level (for example, when voltage 115 ($V_{low}$) falls below the reference voltage 121).

In this manner, the system minimizes variations in the current slew rate of the output device 112 that would otherwise occur over time as a result of temperature, voltage, or processing variations. The controller and control signal output therefrom may be used to control the current slew rate of one or more signal drivers. This allows for faster signal drivers and the ability to provide more signal drivers on a given chip or chip set.

Figure 2:
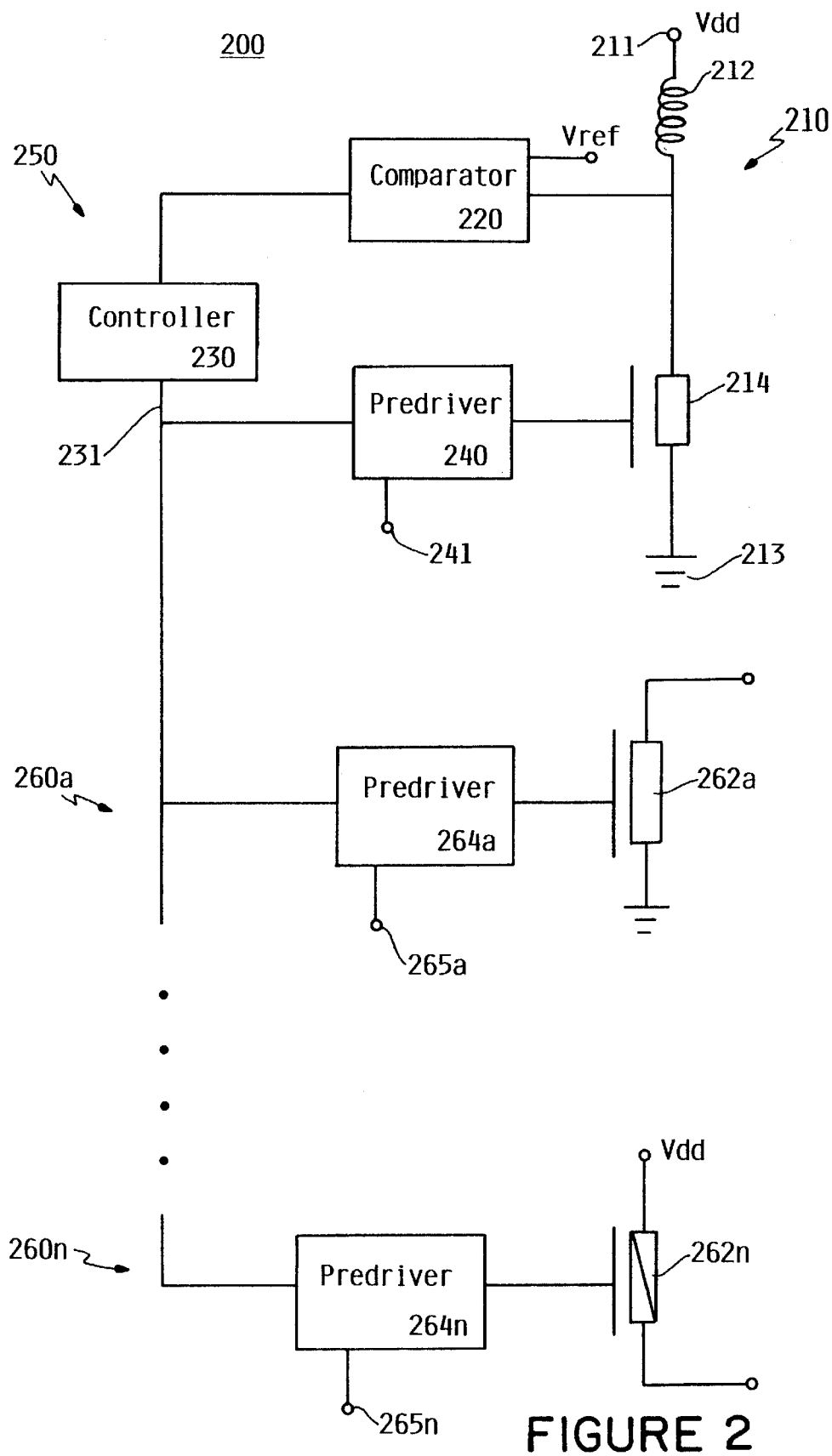
FIG. 2 illustrates an exemplary driver circuit in accordance with one embodiment of the invention.

FIG. 2 illustrates a driver system having a control system for controlling the current slew rate through one or more signal drivers. The system 200 generally includes a control system 250 coupled to one or more driver circuits 260a–n. The control system 250 includes a circuit 210 having an inductor 212 and an output device 214, such as a PFET or NFET transistor, serially coupled between a supply voltage 211 and a ground 213, a comparator 220, a controller 230, and a predriver 240. The control system 250 generally controls the current slew rate through the output device 214 in a manner as described above.

Each of the driver circuits 260a–n includes a signal driver 262a–n, such as a PFET or NFET transistor, for outputting driver signals and a predriver 264a–n for switching the signal driver 262a–n (by providing a voltage slew rate at its gate) in response to an input signal 265a–n. The amount of voltage slew rate is controlled by the controller 230 via control signal 231.

Each predriver 264a–n is configured similar to the predriver 240 of the control system 250 such that the same voltage slew rate is provided to the output device 214 and the signal drivers 262a–n in response to an appropriate input signal. It should be appreciated that the sign (±) of the voltage slew rate provided by a given predriver 264a–n to its respective signal driver 262a–n may vary with the type of signal driver, for example PFET or NFET. Each signal driver 262a–n generally has device characteristics similar to those of the output device 214 such that under similar voltage slew rates, similar current slew rates are developed through the output device 214 and each signal driver 262a–n.

In operation, control system 250 periodically induces a current slew rate through the output device 214 by periodically applying a voltage slew rate at its gate, measures the current slew rate, and updates the voltage slew rate settings of the predriver 240 (as well as predrivers 264a–n) to maintain a relatively constant current slew rate through the output device 214 over time. When a particular predriver 264a–n receives an input signal on its input line 265a–n, the predriver 264a–n applies a voltage slew rate to the gate of its respective signal driver 262a–n using the existing voltage slew rate settings of the particular predriver 264a–n as controlled by the controller 230.

In this manner, the current slew rate, noise and switching speed of each signal driver 262a–n is controlled so that variations therein are minimized. The present system is thus able to account for variations in temperature, voltage, and processing which may otherwise affect the switching speed and noise of the signal drivers. The present system also allows for faster drivers and/or chips with larger numbers of drivers to be designed.

In one exemplary embodiment, a single control system 250 is used to control both PFET and NFET signal drivers. However, the invention is not so limited. In other embodiments, for example, two separate control systems may be provided to separately control the PFET and NFET signal drivers of a driver system, or a separate control system may be provided for each individual signal driver, i.e., for each PFET or NFET transistor.

Figure 3:
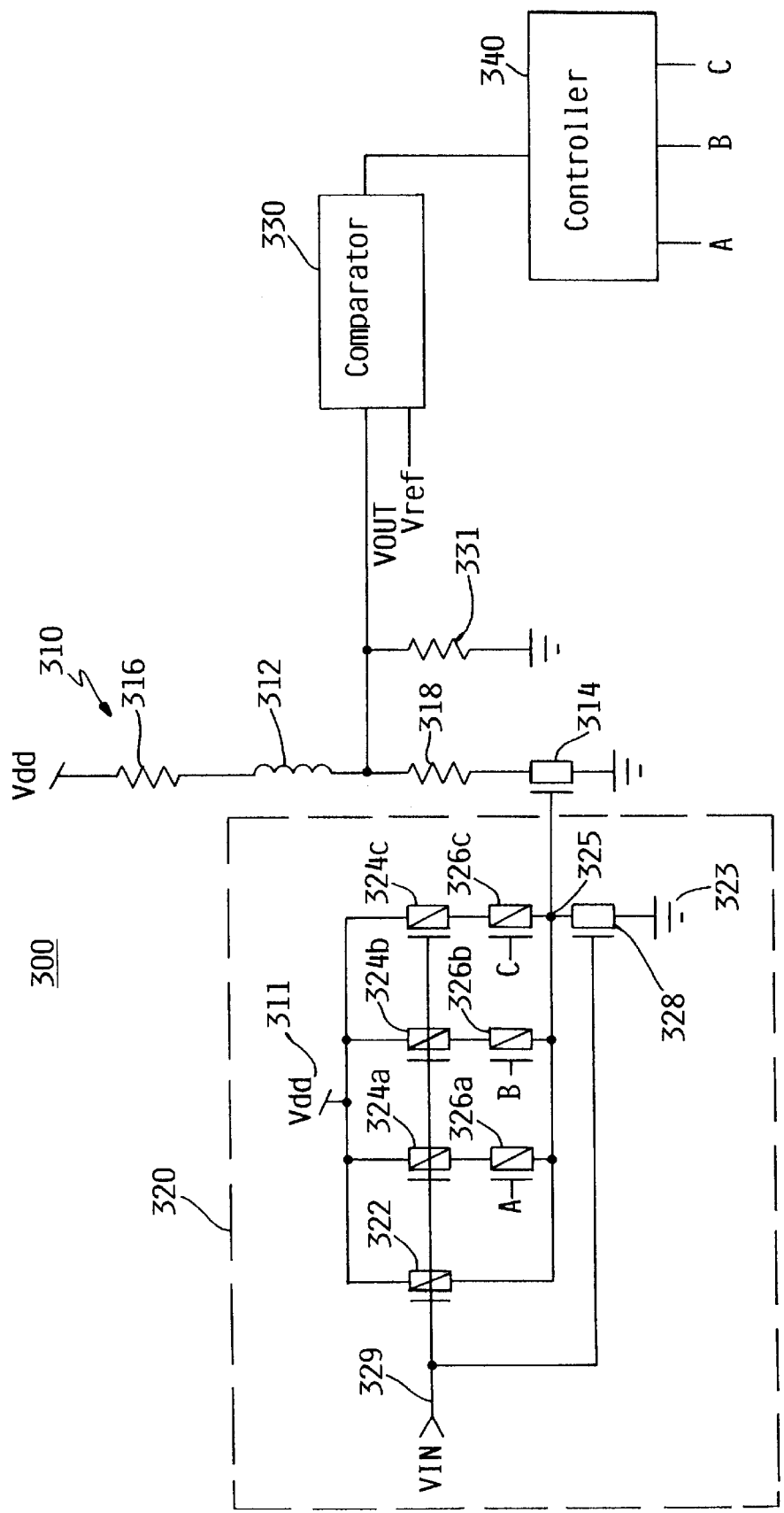
FIG. 3 illustrates another driver control system in accordance with another embodiment of the invention.

FIG. 3 generally illustrates an exemplary control system for a CMOS driver circuit and, in particular, shows an exemplary predriver in detail. It is noted that, though the illustrated predriver 320 is for the control of an NFET output device, the invention is not so limited. Those skilled in the art will readily recognize that the invention is applicable to the control of p-channel FET (PFET) output devices as well.

The system 300 generally includes a circuit 310, a predriver circuit 320, a comparator 330 and a controller 340. The circuit 310 includes an inductor 312 and a resistance, illustrated by resistor 318, serially coupled between a supply voltage Vdd and ground. The supply voltage Vdd may, for example, be 5V, 3V, 2.5V, etc., and in the illustrated embodiment is 5V. The resistor 318 is generally relatively large as compared to the effective resistance of the inductor 312 and is used to establish the maximum current through the output device 314. An exemplary value of the resistor 318 is about 30 ohms. A relatively small resistance 316 is shown to represent the inherent resistance of the wiring. The inductor 312 typically has a relatively small inductance so that changes in the current therethrough result in changes in the inductor voltage capable of being measured by the comparator. An exemplary inductance for the inductor 312 is 0.02 microhenries. Typically the control system 300 is provided on an integrated circuit chip with the inductor 312 off the chip. However, in some embodiments the inductor 312 may be on-chip.

The predriver 320 includes gate transistors 324*a–c* coupled in parallel between the supply voltage and the gate of the output device 314 and responsive to input signal 329. Serially coupled with gate transistors 324*a–c* are current controlling devices 326*a–c*. In the exemplary embodiment, the gate transistors 324*a–c* as well as the current controlling devices 326*a–c* are PFETS.

The current controlling devices 326*a–c* are responsive to control signals A, B, and c from the controller 340 for increasing and decreasing the voltage slew rate at the gate of the output device 314, as will be discussed further below. The predriver 320 may further include a gate transistor 322 coupled in parallel with gate transistors 324*a–c* to allow some threshold amount of voltage slew rate to be applied to the output device gate 322 when the gate transistor 322 is turned on. The gate transistor 322 in the exemplary embodiment is also a PFET. It should be appreciated that the number of current controlling devices 326*a–c* and associated gates 324*a–c* is provided by way of example, not of limitation. More or less current controlling devices may be provided depending on the desired precision of the control system.

The voltage slew rate at the output device gate increases and decreases proportionally with the current slew rate at node 325, which in turn depends on the current slew rate through the current controlling devices 326*a–c*. As more current control devices 326*a–c* are turned on, the voltage slew rate to the output device 314 and current slew rate through the output device increases. Conversely, as more current control devices 326*a–c* are turned off, the voltage slew rate to the output device 314 and current slew rate through the output device 314 decreases.

In operation, the predriver 320 periodically receives a negative pulse on the input signal 329. The input pulse may be a full-swing, rail-to-rail signal from 5 volts to 0 volts, for example. The input pulse is typically provided with a period long enough for the induced voltage across the inductor to drop to zero between successive pulses.

The negative input pulse turns on gate transistors 322 and 324*a–c* and induces a current flow through gate transistor 322 as well as any current control devices 326*a–c* which are turned on. The current flow induces a voltage slew rate at the gate of the output device 314, which induces a current slew rate through the output device 314 and the inductor 312. As discussed above, the current slew rate induces a voltage across the inductor 312. The induced voltage is sensed by the comparator 330 and compared against a threshold voltage to generate an output signal indicative of whether the current slew rate exceeds or falls below a desired level. The comparator may, for example, be a conventional differential comparator. In an alternate embodiment, the comparator may be a ratioed PFET/NFET CMOS inverter, as discussed above.

In response to the comparator output signal, the controller 340 outputs control signals A, B, and C which respectively control current control devices 326*a*, 326*b*, and 326*c*. If the controller determines that an increase (or decrease) in current slew rate is warranted, an additional one or more current limiting device is turned on (or off). In this manner, the variation of the current slew rate through the output device 314 and the signal drivers associated therewith is minimized.

For turning the control devices 326*a–c* on and off, the output signals A, B, and C may, for example, be used to set a latch to couple the gates of the current control devices 324*a–c* to an appropriate voltage source. In the exemplary embodiment, for example, the gate of a PFET current controlling device may be coupled to ground to turn the device on and coupled to the supply voltage Vdd to turn the device off. An exemplary controller is illustrated below.

The predriver 320 may further include transistor 328, coupled between the gate of output device 314 and ground and responsive to the input signal 329, for turning off (i.e., eliminating current flow through) the output device 314. In the exemplary embodiment, the transistor 328 is an NFET which reduces the voltage at the gate of the output NFET 314 below its threshold voltage thereby bringing the current to zero. A pull-down resistor 331 of, for example, 100 Kohms, may further be provided between signal Vout and ground.

Figure 4A:
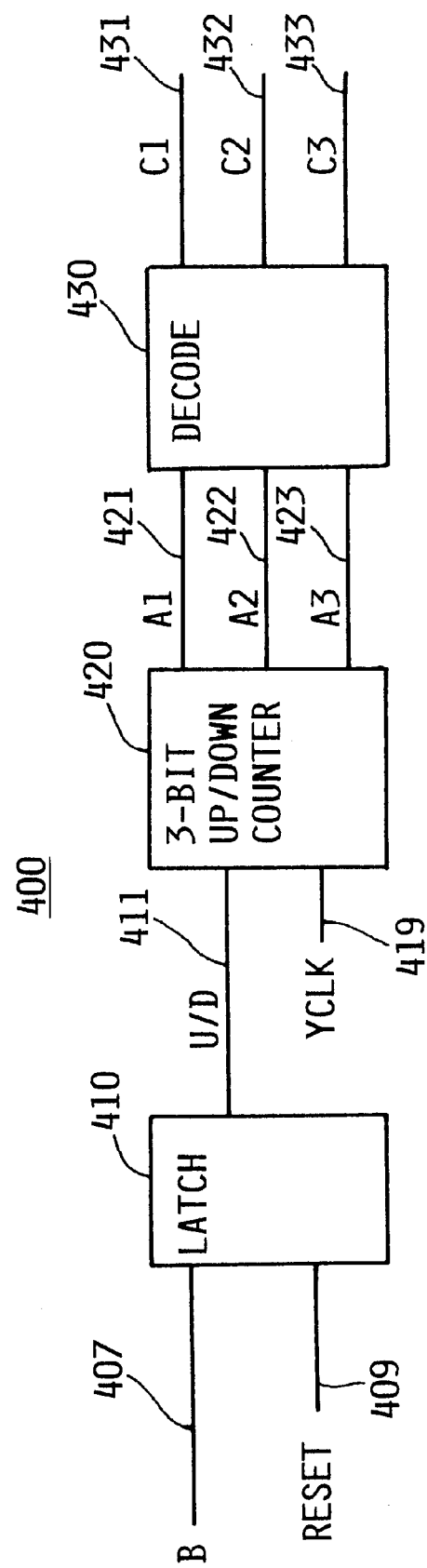
FIG. 4 illustrates an exemplary controller in accordance with an aspect of the invention.

FIGS. 4A and 4B illustrate details of an exemplary controller 400 in accordance one embodiment of the present invention. It should be appreciated that the illustrated controller 400 is shown by way of example, not of limitation. Many different types of controllers and counters may be utilized and are intended to be covered by the invention. For example, the counter may be a Gray Code or Johnson counter. In other embodiments, for example, in chips with small numbers of signals, the controller may be an analog charge pump with an output controlling the gate of the current controlling devices.

The illustrated controller 400 includes a latch circuit 410, counter 420 and decoder 430. Generally, the latch 410 receives a comparator output signal 407 and a reset signal 409 and outputs an up/down (U/D) signal 411 indicating whether the comparator sensed a voltage drop across the inductor greater or less than the reference voltage. The U/D signal 411 and clock signal 419 are provided to counter 420 which appropriately counts up or down depending on the U/D signal 411. For example, as illustrated in FIGS. 5F and 5G, the counter may count down when U/D signal is zero and count up when U/D signal is a one. The counter 420 outputs signals 421, 422, and 423 representing the logic values held by each of its bits. The logic signals 421, 422 and 423 are decoded by decoder 430, which in turn provides control output signals 431, 432 and 433 to the current controlling devices to turn on or off the respective current controlling device. An exemplary decode algorithm for the decoder 430 is illustrated in FIG. 4B. The decode algorithm and counter 420 are provided as examples only. Greater or fewer bits may be used depending on the number of current controlling devices and the desired precision of the control system.

More details of the control system of FIG. 3 and the controller of FIGS. 4A and 4B are shown with reference to FIGS. 5A–5G which illustrate system signals of two exemplary cycles of operation. The Y clock signal 570 and the reset signal 520 are gated clocks derived from the system clock signal 510, for example every eighth clock pulse. The Figures illustrate a first cycle 502 where the counter increments and a second cycle 504 where the counter decrements. In the first cycle 502, the predriver receives a negative pulse 531 which causes input signal 540 to drop below Vref at 541. This causes the comparator to pulse at 551 which triggers a U/D signal of one at 561. At Y clock pulse 571, the counter reads the U/D signal of one and increments. In cycle 504, input pulse 532 does not cause signal A to fall below the reference voltage, as shown at 542. As a result, the comparator does not pulse and the U/D signal 560 stays at zero. At Y clock pulse 572, the counter reads a U/D signal 560 of zero and decrements.

As noted above, the present invention is applicable to a number of drivers in which it is desirable to control the current slew rate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A control system for controlling the current slew rate through an output device having a gate, comprising:
   a circuit having an inductor and the output device serially coupled between a voltage source and a ground;
   a driver coupled to the circuit for providing a voltage slew rate at the output device gate;
   a comparator coupled to the circuit for sensing a voltage indicative of the current slew rate through the inductor and outputting a signal indicating whether the current slew rate exceeds or falls below a desired level; and
   a controller responsive to the comparator for controlling the driver to increase and decrease the voltage slew rate at the output device gate when the comparator signal indicates that the current slew rate respectively falls below and exceeds the desired level, thereby controlling the current slew rate through the inductor and through the output device.

2. The system of claim 1, wherein the voltage slew rate at the output device gate is provided periodically.

3. The system of claim 2, wherein the voltage slew rate is periodically provided such that the current through the inductor stops between applications of the voltage slew rate.

4. The system of claim 1, wherein the circuit includes a resistor serially coupled with the inductor and the output device.

5. The system of claim 1, further including a transistor coupled between the output device gate and the ground.

6. The system of claim 1, wherein the driver includes a plurality of current controlling devices coupled between the voltage source and the ground, each current controlling device being controlled by the controller to vary the voltage slew rate at the gate of the output device.

7. The system of claim 6, wherein each current limiting device is associated with one of a plurality of gate transistors, each gate transistor being responsive to an input signal for allowing current to pass through a current limiting device which is turned on.

8. The system of claim 7, wherein the current controlling devices and gate transistors are p-channel field effect transistors.

9. The system of claim 1, wherein the output device is an n-channel field effect transistor.

10. The system of claim 1, wherein the output device is a p-channel field effect transistor.

11. A method for controlling the current slew rate of an output device having a gate, comprising:
    providing a circuit including an inductor and the output device serially connected between a supply voltage and a ground;
    providing a voltage slew rate at the gate of the output device to generate the current slew rate through the output device;
    measuring the current slew rate through the output device by sensing a voltage indicative of a voltage induced across the inductor; and
    increasing the voltage slew rate at the output device gate when the measured current slew rate falls below a desired level and decreasing the voltage slew rate at the output device gate when measured current slew rate exceeds the desired level, thereby controlling the current slew rate through the output device;
    wherein the voltage slew rate is provided periodically.

12. The method of claim 11, wherein the voltage slew rate is periodically provided such that the current-through the inductor stops between applications of the voltage slew rate.

13. The method of claim 11, wherein the circuit includes a resistor serially coupled with the inductor and the output device.

14. The method of claim 11, further including providing a plurality of current limiting devices coupled between the voltage source and the output device, wherein the increasing and decreasing the voltage slew rate includes turning on and off one or more of the plurality of current limiting devices.

15. An off-chip driver system having an inductance-controlled current slew rate, comprising:
    an output device having a gate and one or more signal drivers each having a gate;
    the output device and signal drivers each having a predriver for providing a voltage slew rate to the respective output device and signal driver; and
    a circuit having the inductor and the output device serially coupled between a voltage source and a ground;
    a comparator coupled to the circuit for sensing a voltage indicative of a current slew rate through the inductor and outputting a signal indicating whether the current slew rate through the inductor falls below or exceeds a desired level;
    a controller responsive to the comparator for controlling the predrivers to increase and decrease the voltage slew rate at the gate of each of the output device and the signal drivers when the current slew rate through the inductor respectively falls below and exceeds the desired level, thereby controlling the current slew rate through the second output device.

16. The system of claim 15, wherein the voltage slew rate is provided periodically.

17. The system of claim 16, wherein the voltage slew rate is periodically provided such that the current through the inductor stops between applications of the voltage slew rate.

18. The system of claim 17, wherein the inductor circuit includes a resistor serially coupled with the inductor and the output device.

19. The system of claim 15, wherein each predriver includes a plurality of current controlling devices coupled between the voltage source and the respective output device and signal driver, wherein the controller increases and decreases the voltage slew rate at the gate of each output device and signal driver by turning on and off one or more of the plurality of current controlling devices in each of the predrivers.

20. The system of claim 15, wherein the inductor is provided on the same chip as the control system.

21. The system of claim 15, wherein the inductor is provided on a different chip than the control system.

22. The system of claim 15, wherein the one or more signal drivers include a plurality of signal drivers at least one of which is a PFET transistor and one of which is an NFET transistor.

23. The system of claim 15, wherein the one or more signal drivers includes an NFET transistor.

24. The system of claim 15, wherein the one or more signal drivers includes an PFET transistor.

25. A control system for controlling the current slew rate of an output driver, comprising:
   a circuit having an inductor and an output device serially coupled between a voltage source and a ground;
   a predriver, coupled to the output device, arranged to provide a controlled voltage slew rate, at a terminal of the output device, which induces a current slew rate through the circuit;
   a comparator coupled to the circuit for sensing a voltage indicative of the current slew rate through the circuit and generating an output signal indicating whether the current slew rate exceeds or falls below a desired level; and
   a controller arranged to, in response to the comparator output signal, set the controlled voltage rate for controlling the current slew rate through the output device and set a controlled voltage rate to a predriver of the output driver for controlling a current slew rate through the output driver.

26. The control system of claim 25, wherein the predriver of the control system includes a plurality of switches for providing the controlled voltage rate to the output device, the controller arranged to output control signals to the predriver of the control system to turn the switches on and off and to output the control signals to the predriver of the output driver to set switches of the predriver of the output driver.

27. The control system of claim 26, wherein each switch of the control system predriver includes a transistor having a gate controlled by the controller.

28. The control system of claim 27, wherein the control system predriver further includes a plurality of second transistors responsive to a common input signal, each of the plurality of second transistors being serially coupled with one of the control system predriver switches.

29. The control system of claim 26, wherein the controller includes a counter which increments and decrements in response to the output signal and a decoder which decodes the counter for controlling the control signals.

30. The control system of claim 26, wherein the control system predriver is responsive to an input signal, separate from an input signal for the output driver, the input signal for the control system being applied periodically for periodically updating the control signals generated by the controller.

31. A method of controlling the current slew rate of an output driver, comprising:
   (a) applying a controlled voltage slew rate at a terminal of an output device using a first predriver to generate a current slew rate through the output device;
   (b) measuring the current slew rate through the output device by sensing a voltage indicative of a voltage induced across an inductor serially coupled to the output device;
   (c) in response to measuring the current slew rate through the output device, generating a control setting for the first predriver for setting the controlled voltage slew rate and controlling the current slew rate through the output device; and
   (d) providing the control setting to a second predriver associated with the output driver for controlling the current slew rate through the output driver.

32. The method of claim 31, further including periodically repeating (a)–(c) to update the control setting.

33. The method of claim 32, wherein periodically repeating (a)–(c) includes periodically receiving an input signal to the to the first predriver.

34. The method of claim 31, further including generating an output signal with the output driver in response to an input signal and the control setting.

35. The method of claim 34, wherein generating the output signal with the output driver includes using a plurality of switches having states set according to the control setting.

36. The method of claim 34, wherein the input signal to the first predriver is provided without reference to an input signal for the second predriver.

37. The method of claim 31, wherein applying the controlled voltage slew rate includes using a plurality of switches having states set according to the control setting.

38. A driver system, comprising:
   an output driver system comprising:
      an output driver; and
      a first predriver, coupled to the output driver, arranged to provide a controlled voltage slew rate at a terminal of the output driver to control the current slew rate through the output driver; and
   a control system, coupled to the output driver system, comprising:
      a circuit having an inductor and an output device serially coupled between a voltage source and a ground;
      a second predriver, coupled to the output device, arranged to provide a controlled voltage slew rate, at a terminal of the output device, which induces a current slew rate through the circuit;
      a comparator coupled to the circuit for sensing a voltage indicative of the current slew rate through the circuit and generating an output signal indicating whether the current slew rate exceeds or falls below a desired level; and
      a controller which, in response to the comparator output signal, sets the controlled voltage slew rate to the second predriver to control the current slew rate through the output device and sets the controlled voltage slew rate of the first predriver to control the current slew rate through the output driver.

39. The driver system of claim 38, wherein the output driver and the output device have similar current slew rate to voltage slew rate characteristics.

40. The driver system of claim 38, wherein the second predriver periodically receives an input signal such that the controller periodically updates the control signals.

41. The driver system of claim 40, wherein the first predriver receives an input signal, different from the input signal received by the second predriver, and uses the updated control signals to generate an output signal in response to the input signal received by the first predriver.

42. The driver system of claim 38, wherein the first and second predrivers each include a plurality of switches for providing the controlled voltage slew rate to the output driver and output device, respectively, wherein the controller outputs signals for setting the switches for each of the first and second predrivers.

* * * * *